US009966966B2

(12) United States Patent
Czaplewski et al.

(10) Patent No.: US 9,966,966 B2
(45) Date of Patent: May 8, 2018

(54) NONLINEARITY INDUCED SYNCHRONIZATION ENHANCEMENT IN MECHANICAL OSCILLATORS

(71) Applicant: UCHICAGO ARGONNE, LLC, Chicago, IL (US)

(72) Inventors: David A. Czaplewski, Naperville, IL (US); Omar Lopez, Chicago, IL (US); Jeffrey R. Guest, Northbrook, IL (US); Dario Antonio, Rio Negro (AR); Sebastian I. Arroyo, Buenos Aries (AR); Damian H. Zanette, Rio Negro (AR)

(73) Assignee: UChicago Argonne, LLC, Chicago, IL (US)

( * ) Notice: Subject to any disclaimer, the term of this patent is extended or adjusted under 35 U.S.C. 154(b) by 116 days.

(21) Appl. No.: 15/001,740

(22) Filed: Jan. 20, 2016

(65) Prior Publication Data
US 2017/0207789 A1 Jul. 20, 2017

(51) Int. Cl.
*H03B 5/30* (2006.01)
*H03L 7/24* (2006.01)
(Continued)

(52) U.S. Cl.
CPC ............ *H03L 7/24* (2013.01); *G01C 19/5776* (2013.01); *H03B 5/124* (2013.01); *H03B 5/1215* (2013.01);
(Continued)

(58) Field of Classification Search
CPC .. G01C 19/5776; G01C 19/5712; H03B 5/30; H03B 5/124; H03B 5/1228;
(Continued)

(56) References Cited

U.S. PATENT DOCUMENTS 7,301,643 B2 11/2007 Kenda et al.
7,724,103 B2 5/2010 Feng et al.
(Continued)

OTHER PUBLICATIONS

Antonio, et al., Nonlinearity-Induced Synchronization Enhancement in Micromechanical Oscillators, Physical Review Letters, PRL 114, 034103, Jan. 23, 2015, 5 pages.
(Continued)

*Primary Examiner* — Arnold Kinkead
(74) *Attorney, Agent, or Firm* — Foley & Lardner LLP

(57) ABSTRACT

An autonomous oscillator synchronizes to an external harmonic force only when the forcing frequency lies within a certain interval, known as the synchronization range, around the oscillator's natural frequency. Under ordinary conditions, the width of the synchronization range decreases when the oscillation amplitude grows, which constrains synchronized motion of micro- and nano-mechanical resonators to narrow frequency and amplitude bounds. The present invention shows that nonlinearity in the oscillator can be exploited to manifest a regime where the synchronization range increases with an increasing oscillation amplitude. The present invention shows that nonlinearities in specific configurations of oscillator systems, as described herein, are the key determinants of the effect. The present invention presents a new configuration and operation regime that enhances the synchronization of micro- and nano-mechanical oscillators by capitalizing on their intrinsic nonlinear dynamics.

20 Claims, 11 Drawing Sheets

(51) Int. Cl.
*H03K 5/003* (2006.01)
*H03K 5/13* (2014.01)
*H03B 5/12* (2006.01)
*G01C 19/5776* (2012.01)
*H03L 5/00* (2006.01)
*H03K 5/00* (2006.01)

(52) U.S. Cl.
CPC ......... *H03B 5/1218* (2013.01); *H03B 5/1228* (2013.01); *H03B 5/30* (2013.01); *H03K 5/003* (2013.01); *H03K 5/13* (2013.01); *H03L 5/00* (2013.01); *H03K 2005/00286* (2013.01)

(58) Field of Classification Search
CPC ....... H03B 5/1215; H03B 5/1218; H03L 5/00; H03K 5/003; H03K 5/13; H03K 2005/00286
USPC .................................. 331/154, 116 M, 37, 46
See application file for complete search history.

(56) References Cited

U.S. PATENT DOCUMENTS

| | | | |
|---|---|---|---|
| 7,843,238 B2 | 11/2010 | Ravatin et al. | |
| 8,044,737 B2 | 10/2011 | Mohanty et al. | |
| 8,063,535 B2 | 11/2011 | Mohanty et al. | |
| 8,577,320 B2 | 11/2013 | Quinsat et al. | |
| 8,723,611 B2 | 5/2014 | Kaajakari | |
| 8,746,064 B2 | 6/2014 | Dienel et al. | |
| 8,836,444 B2 | 9/2014 | Lopez et al. | |
| 8,947,171 B1 | 2/2015 | Mohanty | |
| 2009/0267700 A1 | 10/2009 | Mohanty et al. | |
| 2012/0206210 A1 | 8/2012 | Ivanov et al. | |
| 2014/0159826 A1* | 6/2014 | Phan Le | H03B 5/30 331/154 |

OTHER PUBLICATIONS

Czaklewski, et al., Enhanced Synchronization Range From Non-Linear Micromechanical Oscillators, IEEE, Jun. 21-25, 2015, 4 pages.

Hoppensteadt, et al., Synchronization of MEMS Resonators and Mechanical Neurocomputing, IEEE Transactions on Circuits and Systems: Fundamental Theory and Applications, vol. 48, No. 2, Feb. 2001, 6 pages.

* cited by examiner

NONLINEARITY INDUCED SYNCHRONIZATION ENHANCEMENT IN MECHANICAL OSCILLATORS

The United States Government has rights in this invention pursuant to Contract No. DE-AC02-06CH11357 between the United States Department of Energy and the UChicago Argonne, LLC, representing Argonne National Laboratory.

TECHNICAL FIELD

The present disclosure relates generally to micro- and nano-mechanical oscillators and the methods of forming the same.

BACKGROUND

Mechanical oscillators are an essential component of practically every electronic system requiring a frequency reference for time keeping or synchronization and are also widely used in frequency-shift based sensors of mass, force, and magnetic field. Currently, micro- and nano-mechanical (collectively referred to as "micromechanical" herein) oscillators are being developed as an alternative to conventional oscillators, e.g. quartz oscillators, supported by their intrinsic compatibility with standard semiconductor processing and by their unprecedented sensitivity and time response as miniaturized sensing devices.

Generally, synchronization is possible when the frequency of an externally applied harmonic perturbation, $\Omega s$, lies close enough to the oscillator's frequency $\Omega_0$, such that $|\Omega s - \Omega_0| < \Delta\Omega$ where $2\Delta\Omega$ is the synchronization range. Usually, the larger the interaction with the external harmonic perturbation, the further the frequency can be shifted and the larger the synchronization range. Additionally, the width of the synchronization range decreases as the amplitude of the linear oscillator increases. In other words, the ability to change the frequency of operation to an external harmonic perturbation decreases as the self-sustained drive force of the linear oscillator is increased.

Unfortunately, as the dimensions of the vibrating structures are reduced to the micro- and nano-scale their dynamic response at the amplitudes needed for operation frequently becomes nonlinear, with large displacement instabilities and excessive frequency noise considerably degrading their performance. These factors would seem to preclude micromechanical oscillator systems, specifically the micro- and nano-resonators, from being used in timing applications.

SUMMARY

Embodiments described herein relate generally to micromechanical oscillators and the methods of forming the same and, in particular, using device parameters and dynamics in conjunction with higher-order nonlinearities and harmonics to affect the synchronization range more dramatically.

In some embodiments, a method for synchronizing an external harmonic perturbation with an oscillator by matching the frequencies. This method includes, amplifying a voltage, using an amplifier, from an oscillator and creating an amplification value and an operating frequency in the oscillator. Maintain the operating frequency and phase shifting the amplified voltage. A resonator is placed in self-sustained motion and an external signal is coupled into the oscillator feedback loop, where the frequency of the external signal is changed until the external frequency approaches the operating frequency. At a critical frequency offset from the operating frequency, the oscillator becomes synchronized with the external harmonic perturbation.

An illustrative system includes an amplifier operably connected to a phase shifter. The amplifier is configured to amplify a voltage from an oscillator. The amplifier can also be used to convert the current from the oscillator into a voltage (transimpedance amplifier). The phase shifter is operably connected to a driving amplitude control, wherein the phase shifter is configured to phase shift the amplified voltage and is configured to set an amplitude of the phase shifted voltage. The oscillator is operably connected to the driving amplitude control. The phase shifted voltage drives the oscillator. The frequency of the oscillator is based at least on the amplitude of the phase shifted voltage that synchronizes an external harmonic perturbation that is coupled into the oscillator system.

It should be appreciated that all combinations of the foregoing concepts and additional concepts discussed in greater detail below (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein.

BRIEF DESCRIPTION OF DRAWINGS

The foregoing and other features of the present disclosure will become more fully apparent from the following description and appended claims, taken in conjunction with the accompanying drawings. Understanding that these drawings depict only several implementations in accordance with the disclosure and are therefore, not to be considered limiting of its scope, the disclosure will be described with additional specificity and detail through use of the accompanying drawings.

Figure 1:
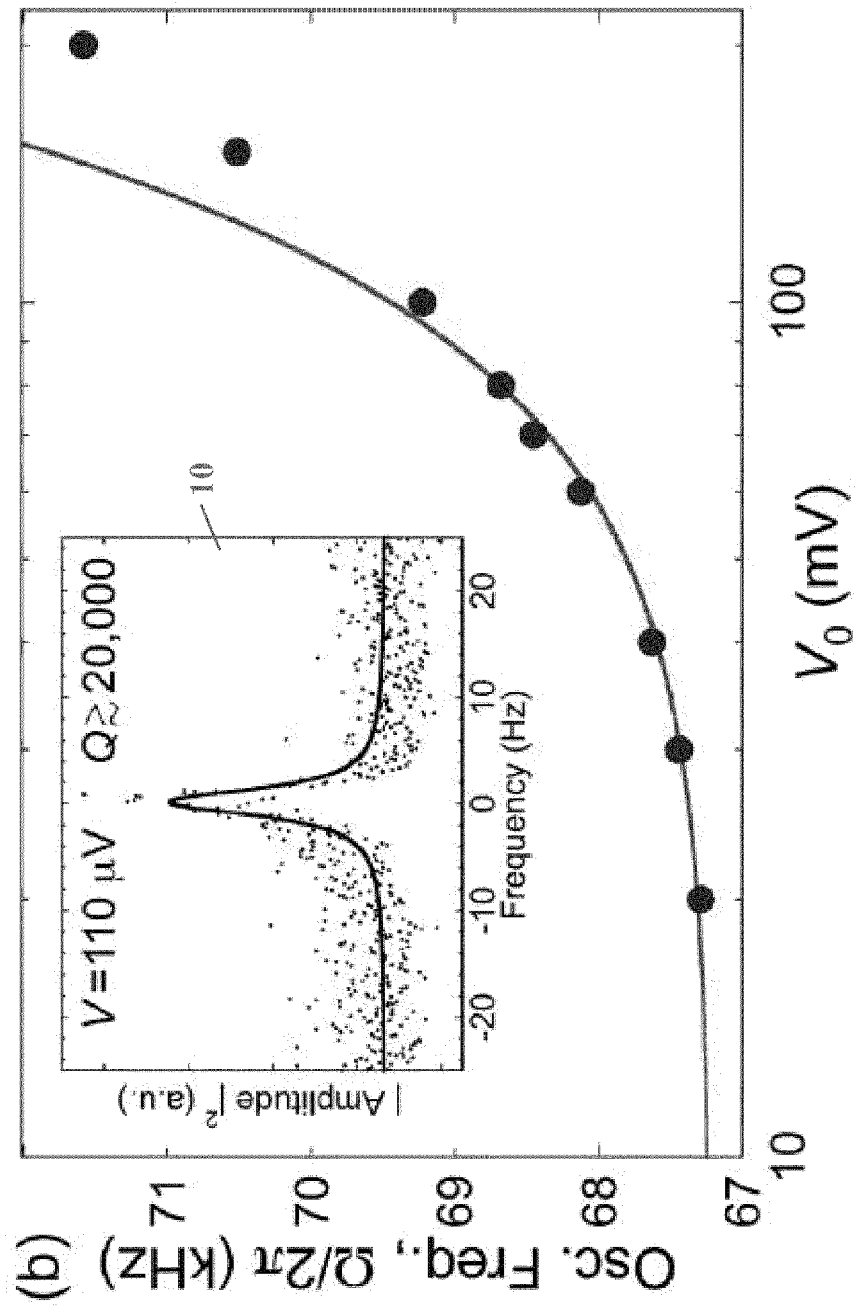
FIG. 1 is a graphical representation of the measured and calculated frequency of the resonator with an applied self-sustained drive and no synchronization drives. The inset of the figure shows the open-loop response when the oscillator is in the linear regime.

Reference is made to the accompanying drawings throughout the following detailed description. In the drawings, similar symbols typically identify similar components, unless context dictates otherwise. The illustrative implementations described in the detailed description, drawings, and claims are not meant to be limiting. Other implementations may be utilized, and other changes may be made, without departing from the spirit or scope of the subject matter presented here. It will be readily understood that the aspects of the present disclosure, as generally described herein, and illustrated in the figures, can be arranged, substituted, combined, and designed in a wide variety of different configurations, all of which are explicitly contemplated and made part of this disclosure.

DETAILED DESCRIPTION OF VARIOUS EMBODIMENTS

Embodiments described herein relate generally to micromechanical oscillators and methods for forming such oscillators.

As the dimensions of oscillators, and therefore the resonators inside of the system, are reduced toward the micro- and nano-scale, the frequency response of the resonators becomes more dependent upon fabrication variances that increase the distribution of operating frequencies of the fabricated resonators. Additionally, in order to produce large output signals, the micromechanical resonators require large driving forces, which result in the dynamic response of the micromechanical resonators becoming nonlinear. These nonlinearities result in large displacement instabilities and excessive frequency noise, thereby considerably decreasing the timing accuracy. These factors would seem to limit micromechanical oscillators from being used in timing and other applications.

In contrast, embodiments of the oscillator described herein and method of constructing the same show that, contrary to the prior art teaching an oscillator operating in a linear regime, a self-sustaining oscillator driven by the present invention's specific nonlinear regime results in an increase in the synchronization range as the amplitude of the oscillator increases. By capitalizing on the micromechanical oscillator's intrinsic nonlinear dynamics, under suitable conditions and using the physical parameters of the present invention described herein, nonlinearities can, in fact, improve the synchronization properties of micromechanical oscillators. The improved synchronization properties described herein have a broader implementation than just timing responses, as they could be also used in tower communications for mobile devices. Specifically, in cellular phone to tower communication, injection locking for driving large power generators, and synchronizing the read-out oscillators with larger voltage signals using vibrations from vibrating sensors that could have smaller voltages to make them more sensitive.

In one implementation, a general mechanism is provided that synchronizes the operating frequency of nonlinear self-sustaining micromechanical oscillators. This can be achieved by coupling two different vibrational signals, an oscillator signal with an amplitude measured as a voltage and an external signal of an amplitude measured as a voltage. Synchronization of the two signals is achieved by altering the externals signal's frequency using a tunable external reference signal generator until the external frequency approaches the operating frequency, at which point the oscillator frequency and the external frequency become synchronized under a wide range of frequencies and for higher amplitude values. The micromechanical resonator is the core of the feedback network for the micromechanical oscillator.

In some embodiments, the micromechanical resonator is a clamped-clamped beam resonator. This type of structure simplifies fabrication at the nanoscale, allows Lorentz force actuation and electromotive detection, and has much higher resonant frequencies than other structures with similar dimensions due to the constraints placed on the ends of the beams. The dynamics of a clamped-clamped beam can be approximated by that of a mass-spring system with a non-linear restoring force $F_r = -k_1 x - k_3 x^3$, where x is the displacement of the beam, $k_1$ is a linear elastic constant, and $k_3$ is a nonlinear elastic constant caused by the elongation of the beam as it moves laterally.

In some embodiments, the clamped-clamped beam resonators can have multiple interconnected parallel beams of varying composition, length, width, and thickness that can be driven deep into a nonlinear regime. In a particular embodiment, the clamped-clamped beam resonator is a silicon structure composed of three interconnected parallel beams, 500 µm in length, 3 µm wide, and 10 µm thick, that are clamped at the two ends of the three beams.

In some embodiments, the clamped-clamped beam resonator is of a flexural design. A flexural resonator is comprised of three, doubly clamped, single crystal silicon beams with comb drives located at the midpoint of the beams on both sides. The beams are anchored together to move as a single resonator. One of the comb drives is used to apply the oscillatory drive signal to the resonator while the other comb drive is used to measure the motional current that results from the movement of the resonator. The primary motion of the resonator is an in-plane flexural motion and the clamped ends of the beams allows for even small displacements to cause the restoring force to become nonlinear. Due to the geometry, a flexural resonator produces a hardening nonlinearity. In other words, the frequency will grow with increasing amplitude until the solution reaches the bifurcation point and transitions to a lower curve.

In its principal oscillation mode, the micromechanical oscillator capacitively produces an output current proportional to the transverse displacement by means of a comb drive electrode. After amplification, the resulting signal is conditioned by shifting the phase by a set amount ($\varphi_0$) and the amplitude is fixed to be $V_0$. This conditioned signal is then reintroduced through another comb drive electrode. The signal is a driving capacitive force that is time varying and proportional to $V_{dc}V(t)$ [where DC voltage $(V_{dc}) \approx 5$ V$\gg$V(t)]. This results in the applied forces F(t) being proportional to the applied drive voltages V(t).

The closed loop sustains the oscillator's parallel beams at a vibration having an amplitude $A_0$, a frequency $\Omega_0$ (both determined by the combination of the mechanical properties), a phase shift $\varphi_0$ and a voltage $V_0$. As a result of the structure, the amplitude $A_0$ attains a maximum when the driving force is in phase with the oscillation velocity. This resonance condition is achieved in the phase shifter by advancing the oscillating signal by $\varphi_0=\pi/2$. This results in the frequency of the self-sustained oscillations $\Omega_0$ increasing as the Voltage $V_0$ increases, a byproduct of the hardening nonlinearity in the dynamics of the oscillator.

Next, an external harmonic perturbation ("external perturbation") is supplied into the system. The external perturbation is aimed to entrain the oscillator into synchronized motion with the source of the signal. The external perturbation consists of a voltage signal of amplitude $V_s$ and frequency $\Omega_s$ which is added to the self-sustaining signal. The complete and accurate set of equations describing dynamics of a single micromechanical oscillator is not known due to many implementation details altering the outcome. In other words, the physical construction of an oscillator and its system parameters dictate the performance of the oscillator.

The following sections provide various examples of the measured synchronization range of various micromechanical oscillators formed using the methods described herein. These examples are for illustration purposes only and are not intended to limit the disclosure.

Generally, the motion of the principal oscillation mode is described by Newton's equation for a normal coordinate x(t), with a cubic nonlinear term, given by the Duffing equation:

$$m\ddot{x}+\gamma\dot{x}+kx+k_3x^3=F_0\cos(\varphi+\varphi_0)+F_s\cos\Omega_s t$$

where m is the effective mass, $\gamma$ is the damping constant, k is the linear force spring constant, $k_3$ is the cubic-force spring constant, $F_0$ is the self-sustaining force, $F_s$ is the external harmonic perturbation and $\Omega_s$ is the frequency of the externally applied harmonic perturbation.

Normalizing by the spring constant k and choosing time units such that the natural frequency of the principal mode equals unity ($t\sqrt{k/m}=t$), then the equation of motion reads:

$$\ddot{x}+Q^{-1}\dot{x}+x+\beta x^3=f_0\cos(\varphi+\varphi_0)+f_s\cos\Omega'_s t$$

where the quality factor is $Q=\sqrt{km}/\gamma$, $\beta$ is the ratio of cubic-force spring constant to the linear spring constant, $f_0$ is the self-sustaining force normalized by the spring constant, $f_s$ is the external harmonic perturbation normalized by the spring constant, and $\Omega'_s$ is equal to $\Omega s/\sqrt{km}/\gamma$. The cubic-term coefficient $\beta$ is positive for hardening and negative for softening nonlinearities.

The amplitude, $f_0$, and phase shift, $\varphi_0$, of the self-sustaining force determine the conditioning of the feedback signal. In the present invention, the phase shift was $\pi/2$, as the self-sustaining force is maximized when this phase shift is applied. The angle $\varphi(t)$ is the instantaneous oscillation phase of the coordinate x(t). When the synchronization force $f_s$ is applied with a tunable frequency $\Omega'_s$ and the $\beta\neq0$ or in other words, when the cubic-force spring constant is nonlinear, the resulting system in the present invention is such that the force amplitudes $f_0$ and $f_s$ are proportional to the voltages $V_0$ and $V_s$ respectively. With no applied synchronization force ($f_s=0$), the coordinate phase is determined by $x(t)=A_0\cos\varphi=A_0\cos\Omega'_0 t$, and the present invention's system attains oscillations of frequency $\Omega'_0$ and amplitude $A_0$ results in the explicit expressions:

$$\Omega'_0 = \frac{1}{\sqrt{2}}\left[1+(1+3\beta Q^2 f_0^2)^{\frac{1}{2}}\right]^{\frac{1}{2}}$$

$$A_0 = Qf_0/\Omega'_0$$

FIG. 1 is a graphical representation of the measured and calculated frequency of the flexural resonator with an applied self-sustained drive voltage and no synchronization drive. All the measurements were done at room temperature and in a vacuum (pressure of $10^{-5}$ mbar) and a DC bias voltage, $V_{dc}$, of 5 V. The solid line is the predicted values from the explicit expression above based on the present inventions parameters and for self-sustained drive voltages of $V_0 \lesssim 100$ mV. The dots represent the measured values of the present invention for the same range. The insert 10 within the graph in FIG. 1 shows the least-squared Lorentzian fit to the amplitude squared of an open loop frequency sweep under weak excitation, where the present invention has physical parameters such that a voltage equal to 110 µV results in a quality factor of $Q \gtrsim 20,000$.

When the driving force is proportional to the self-sustained driving voltage, $f_0 \propto V_0$, the oscillator's mechanical parameters are folded into a parameter a by defining $\alpha V_0=|\beta|^{1/2}Qf_0$. Using the physical properties of the present invention and the fit for $V_0\leq100$ mV in FIG. 1, $\alpha$ is equal to $3.1\pm0.1$ V$^{-1}$ and has a natural frequency of $\sqrt{k/m}=2\pi\times67.22$ kHz. Only when $|\beta|f_0^2 \gtrsim Q^{-2}$ does the self-sustained frequency $\Omega_0$ significantly differ from the natural frequency. But such an outcome only occurs in the nonlinear regime when the magnitude of the nonlinear term ($\sim|\beta|A_0^3$) becomes comparable to or larger than the linear term ($\sim A_0$).

The present invention exhibits synchronized solutions when the external synchronization perturbation ($f_s$) is not equal to zero, such that $\Omega'_s$ lies within the interval $\Omega'_0\pm\Delta\Omega'$. The oscillator's construction is such that the external perturbative force is the synchronization signal, allowing it to be non-zero and results in the interval range. This interval is defined as a function of the ratio between the synchronization and the self-sustaining force, such that $p=f_s/f_0$ and therefore $\Delta\Omega'=p\delta\Omega'_c$. Having $$p = \frac{f_s}{f_0} \ll 1$$

and $Q\gg1$ and plugging such into the equation for motion derived previously, half of the synchronization range takes the form of:

$$\Delta\Omega' = p\delta\Omega'_c = \frac{p}{2Q}\left[\left(\frac{3Q\beta A_0^2}{2\Omega'_0}\right)^2+1\right]^{\frac{1}{2}}$$

This results in a $\Delta\Omega'$ that is not directly dependent on the sign of the nonlinear coefficient $\beta$.

The equation for $\Delta\Omega'$ show that for a linear oscillator (i.e. $\beta=0$) a stronger synchronization force increases the synchronization range, while a stronger self-sustaining force decreases the synchronization range. In the linear oscillator, the full synchronization range, $2\Delta\Omega'$, is proportional to p/Q; in other words, the synchronization range is proportional to the linewidth of the resonant response ($Q^{-1}$) and proportional to the ratio of synchronization force to the self-sustained force (p).

This limiting result found in linear oscillators differs in the discovery of the present invention for nonlinear oscillators (i.e. $\beta\neq0$). In the present invention, the range of synchronization grows when $|\beta|f_0^2 \gtrsim Q^{-3}$, because $\Omega'_0\approx1$. This corresponds to the present inventions regime where the nonlinear term ($\sim|\beta|A_0^3$) becomes comparable to or larger than the dissipative force (~$A_0/Q$). To reach this nonlinear regime when the Q is large, it can be achieved with considerably lower amplitudes and forces.

The resulting equation for the synchronization range of the present invention is accomplished by plugging in the prior amplitude $A_0$ calculation into the half synchronization range equation, $\Delta\Omega'$, and making the substitution of $$\left(\frac{3Q\beta A_0^2}{2\Omega_0'}\right)$$

for the first in the half synchronization range equation term as a result of the present invention having a first term that is large in relation to the second term of 1. The condensed half synchronization range equation is a byproduct of the oscillator's construction and operating conditions and is:

$$\Omega' \approx \frac{f_s f_0}{2}\left[\left(\frac{3Q^2\beta}{2\Omega_0^3}\right)^2\right]^{\frac{1}{2}}$$

This condensed equation predicts that the synchronization range increases with the increasing driving force. Additionally, since the synchronization range is independent of the sign of the nonlinear term $\beta$, the synchronization range will increase for the present invention for both hardening and softening nonlinearities when the nonlinear response becomes large compared to the linear response of the device.

Figure 2:
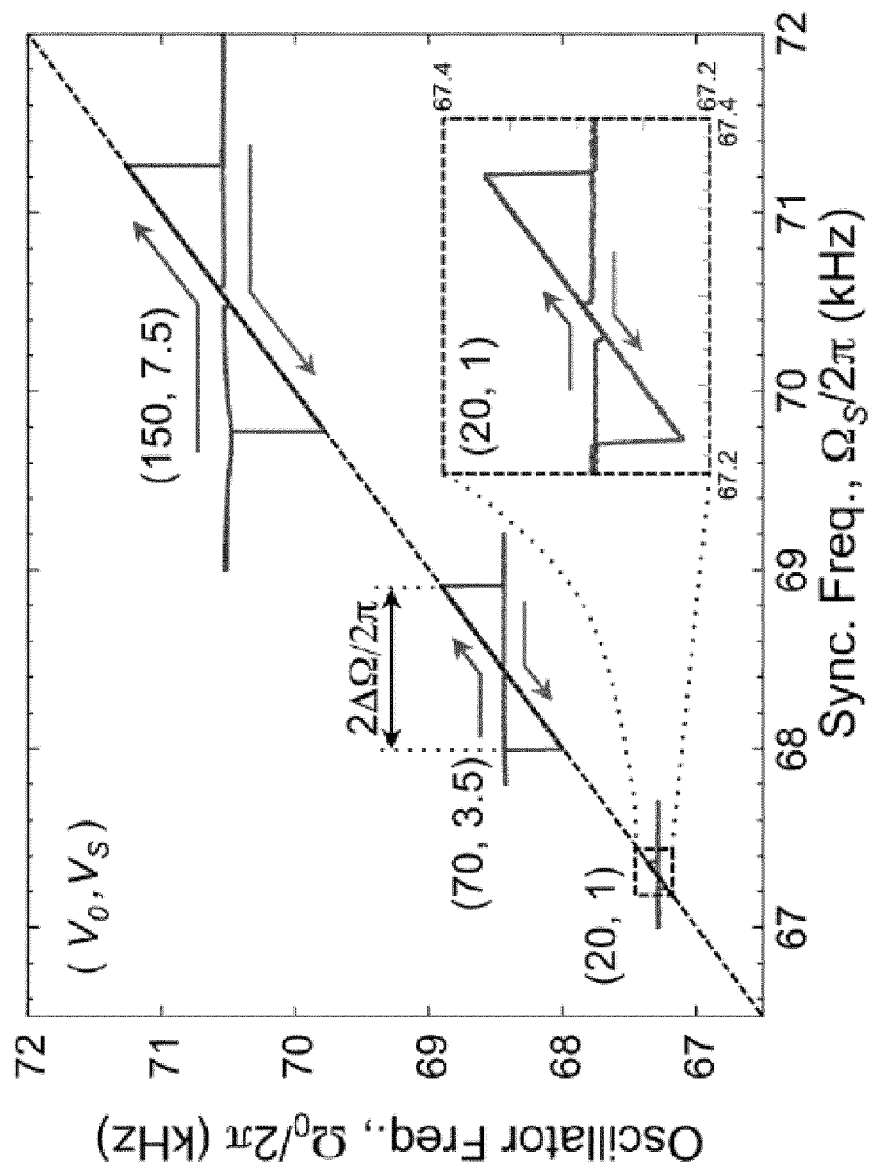
FIG. 2 is a graphical representation of the synchronization behavior in relation to the measured oscillation frequencies for the physical parameters of the present invention.

FIG. 2 presents a clearer picture of the amplitude dependence of the synchronization range for the present invention's nonlinear oscillator with a flexural resonator. All the measurements were done at room temperature and in a vacuum (pressure of $10^{-5}$ mbar). FIG. 2 is a plot of the measured oscillation frequency versus the applied synchronization frequency for various applied self-sustained and synchronization forces. The ratio of the two forces is held constant such that $$p = \frac{f_s}{f_0} = \frac{V_s}{V_0} = 0.05$$

and $\varphi \lesssim \pi/2$. For each pair of ($V_0, V_s$) the synchronization frequency $\Omega_s$ is swept both upwards (blue) and downwards (red). As predicted by FIG. 1, the natural frequency $\Omega_0$ shifts as a function of $V_0$.

In the upward sweep, the oscillator synchronizes with the external harmonic force when $\Omega_s$ reaches the vicinity of $\Omega_0$, above that point the oscillator frequency $\Omega_0$ is identical to the externally applied harmonic perturbation up to approximately 1 part in $10^5$. After that point, if $\Omega_s$ is increased it leads to a sudden de-synchronization at $\Omega_0+\Delta\Omega$. Along the downward sweep, the synchronization continues until $\Omega_s$ reaches $\Omega_0-\Delta\Omega$. In both directions, the sharp de-synchronization transitions within an interval of less than 1 Hz, which is the size of incremental frequency change. Despite the ratio between the forces (p) remaining fixed, the synchronization range is increasing as the force increases. Additionally, when synchronized, fluctuations in the oscillation frequency are reduced because of low noise level in the external oscillator providing the external perturbation force.

Figure 3:
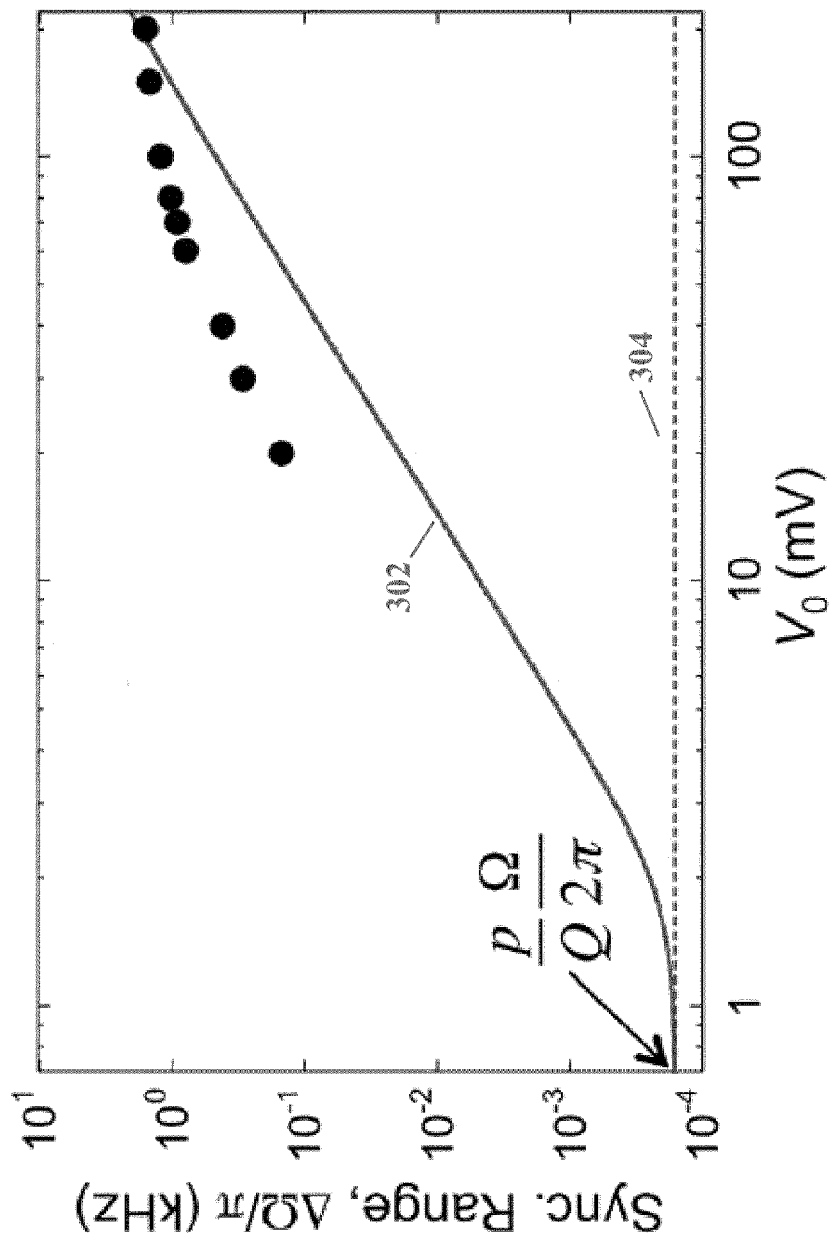
FIG. 3 is a graphical representation of the synchronization behavior in relation to the measured synchronization range as a function of the self-sustained voltage, $V_0$, for the oscillator with a flexural resonator, as well as a predicted range for a linear oscillator.

FIG. 3 illustrates the synchronization range of the present invention with a flexural resonator as a result of the self-sustained drive voltage when the fit value $\alpha=3.1$ $V^{-1}$, p=0.05, $V_0=V_s/p$ and the measured values for $\sqrt{k_m}$ and Q in the present invention. All the measurements were done at room temperature and in a vacuum (pressure of $10^{-5}$ mbar). In FIG. 3, the solid curve represents the nonlinear enhancement $\beta\neq 0$ 302 and shows the predicted condensed half synchronization range for the present invention where Q=20,000. The dotted line represents the linear oscillator $\beta=0$ 304 and shows the predicted behavior of a linear oscillator. As shown in FIG. 3, the present invention was measured having a synchronized range that increased with an increasing drive voltage and was four orders of magnitude greater than the expected range for a linear oscillator, as taught in the prior art.

As seen in FIG. 3, the dependence of the measured synchronization range (the dots) on the drive voltages agrees qualitatively with the predicted values. In some respects, the measured range of the present invention is significantly larger than the prediction, showing that the present invention exceeds that which is predicted by the Duffing equation when the present invention's physical properties were inputted. Specifically, the Duffing equation does not provide a complete prediction of the closed loop and synchronized response of the nonlinear oscillator for large, self-sustaining amplitudes. This increased range occurs more clearly when $V_0$>100 mV, where the measured synchronization range begins to saturate and the behavior deviates qualitatively from the prediction. This is in line with the results seen in FIG. 3 and FIG. 6 in this voltage range. Furthering the earlier observation that a complete and accurate set of equations describing dynamics of a single micromechanical resonator are not known due to many implementation factors that vary with construction.

The present invention has multiple features which may lead to the improvement over the predicted results of the Duffing equation as seen in FIG. 3. For example, the inventions amplitude-dependent parameters dependent on the construction of the present invention, such as a and Q. Additionally, the use of the comb electrodes to pass through the drive and signal transduction in combination with the higher-order nonlinearities and harmonics in the device dynamics lends to increased performance.

Figure 4:
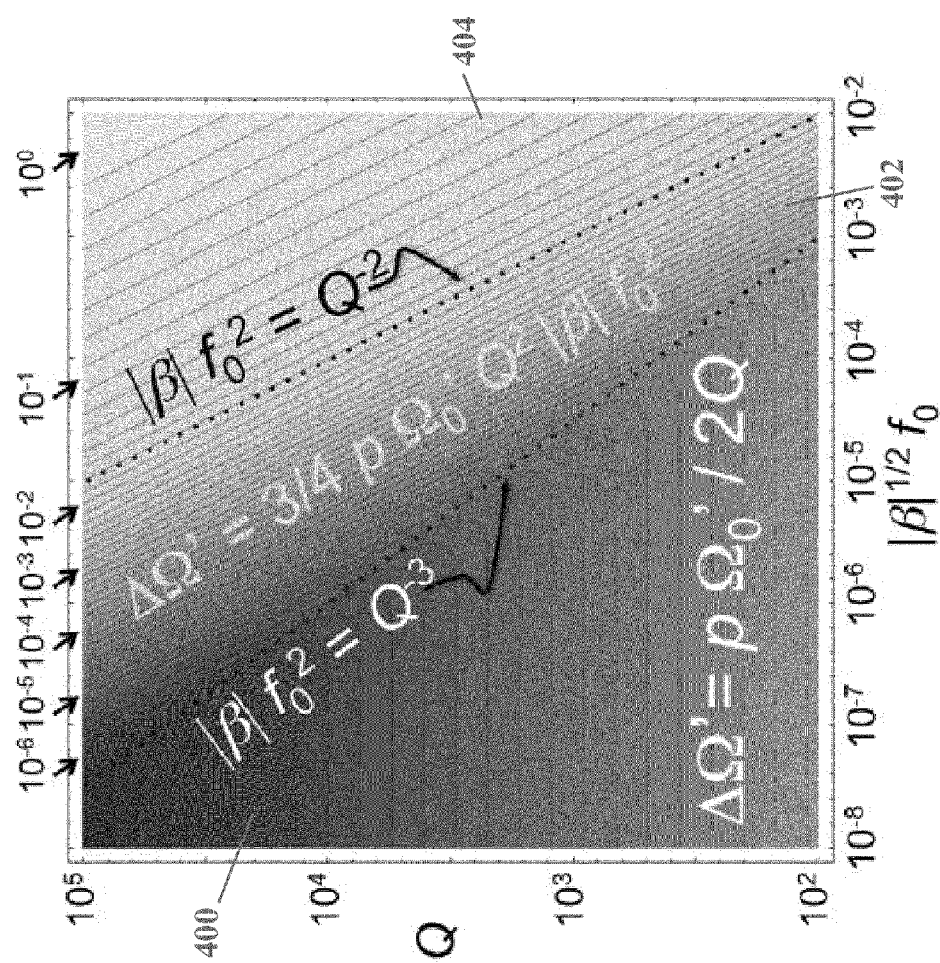
FIG. 4 is a graphical illustration of the predicted synchronization range for three distinct regions of physical parameters of the micromechanical oscillator.

FIG. 4 is a graphical representation of the synchronization range $2\Delta\Omega'$ as a function of both $|\beta|^{1/2}f_0$ and Q as predicted by the condensed half synchronization range equation for a flexural resonator. FIG. 4 has three regions, region one is when $|\beta|f_0^2 \lesssim Q^{-3}$ 400, region two is when $Q^{-3} \lesssim |\beta|f_0^2 \lesssim Q^{-2}$ 402 and region 3 is $|\beta|f_0^2 \gtrsim Q^{-2}$ 404. As seen in region one 400 when $|\beta|f_0^2 \lesssim Q^{-3}$ the nonlinear term ($\beta A_0^3$) is smaller than both the dissipative term ($A_0/Q$) and the elastic term ($A_0$) and the synchronization behavior is characterized by a linear response. In region two 402 when $Q^{-3} \lesssim |\beta|f_0^2 \lesssim Q^{-2}$ the nonlinear term dominates the dissipative term but is still small compared to the elastic term. This regime shows a rapid increase of the synchronization range with increasing nonlinearity or self-sustained driving force as demonstrated by the measurements of our oscillator. In region three 404 when $|\beta|f_0^2 \gtrsim Q^{-2}$ the nonlinear force dominates even the elastic force and the oscillator is deep in the nonlinear regime and the rate of increase of the synchronization range is slowed by the increase in the self-sustained frequency due to the increase (for $\beta>0$) in $\Omega'$.

Figure 5:
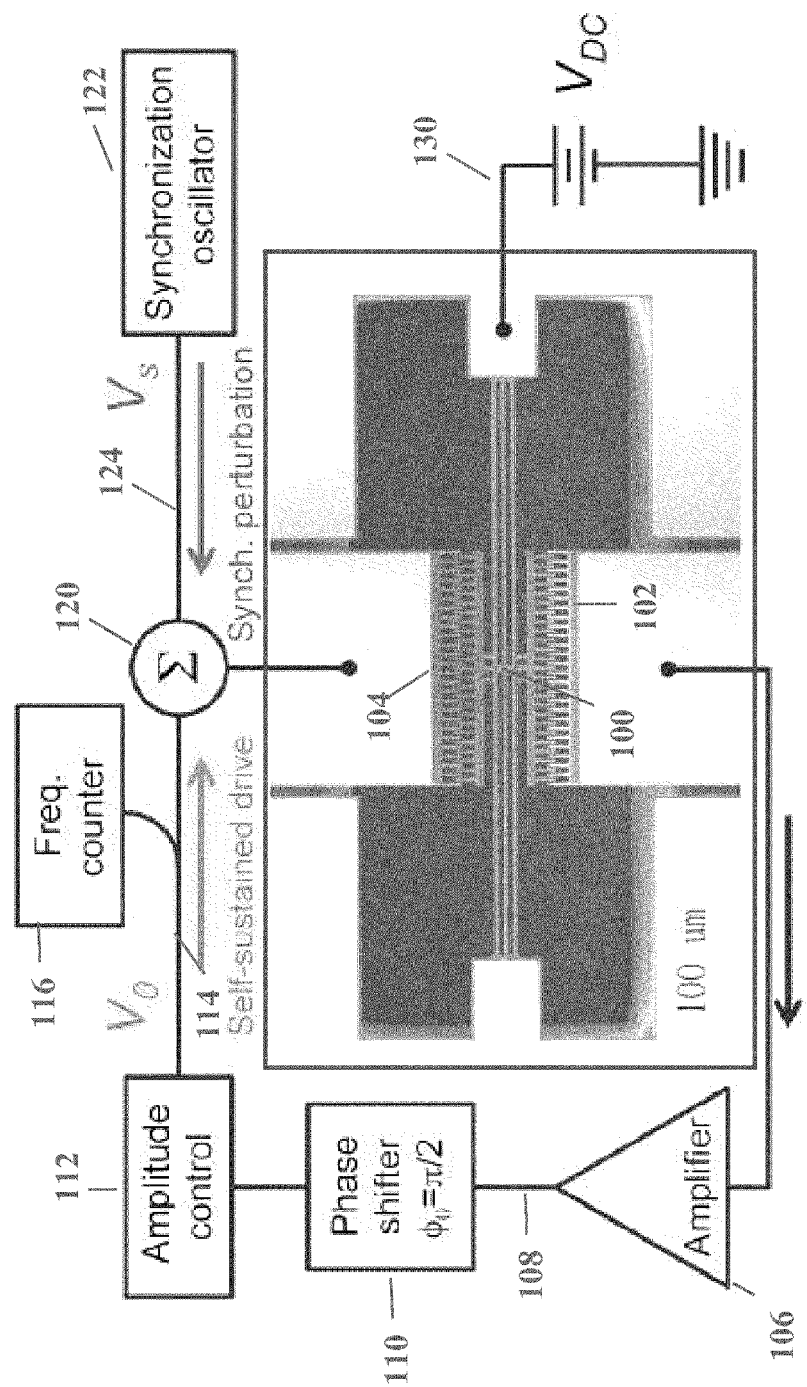
FIG. 5 is a circuit schematic of a flexural resonator used to drive the micromechanical oscillator in a closed loop circuit.

FIG. 5 is a circuit schematic of a clamped-clamped oscillator with a flexural resonator 100 in a closed loop configuration that synchronizes with the frequency of an external harmonic perturbation 124. The motion of the resonator 100 can be detected capacitively, for example, using a detection electrode 102 that includes a capacitor. The capacitance variation of the voltage biased comb drive electrode generates a current that is introduced into a current amplifier 106. The amplifier 106 produces a voltage output proportional to the oscillation amplitude 108. The voltage output can be first phase shifted using a phase shifter 110. For example, the phase shifter 110 can be an active analog implementation of an all-pass filter. The phase shifted voltage can then be used as input of a phase-locked loop (PLL) in a lockin-amplifier (external reference input). The reference output of the lockin amplifier is phase locked to the input reference and its amplitude can be set by a driving amplitude control 112. The driving amplitude control 112 can include an internal function generator that sets the amplitude to a specified value.

The resulting signal at the output is phase locked to the detection signal but phase shifted and with a constant amplitude that can be set independently of the amplitude of the oscillations. The driving amplitude control 112 can include an internal function generator that sets the amplitude to a specified value. This resulting signal can be input into a driving electrode that can be used to drive the resonator 100. The resulting signal can also be input in a frequency meter 116 to measure the frequency of the oscillations. The frequency meter 116 can be a digital frequency counter. The phase shift between the excitation and the detection signal determines the point in the resonance curve where the resonator 100 is phase locked. For instance, to operate the oscillator 100 in the peak of the resonance curve, the phase shift can be set to $\pi/2$. In one example, the $\pi/2$ phase shift was used to produce a maximum amplitude of oscillation.

A weak interaction with an external oscillator 122 supplying an external harmonic perturbation 124 can be added to the existing clamped-clamped oscillator system using a summation amplifier 120. The external DC voltage 130 biases the resonator 100 at $V_{dc}$. The flexural resonator 100 is constructed such that it synchronizes the oscillation frequency 114 by coupling two different vibrational signals, an internal oscillator signal with an amplitude and voltage with an external signal of an amplitude and voltage. Synchronization of the two signals is achieved by altering the externals signal's frequency 124, using a tunable external reference signal generator, until the external frequency 124 approaches the operating frequency 114. At which point the oscillator frequency 114 and the external frequency 124 become synched under a wide range of frequencies and for higher amplitude and voltage values. The flexural resonator 100 is the core of the feedback network for the oscillator.

Figure 6:
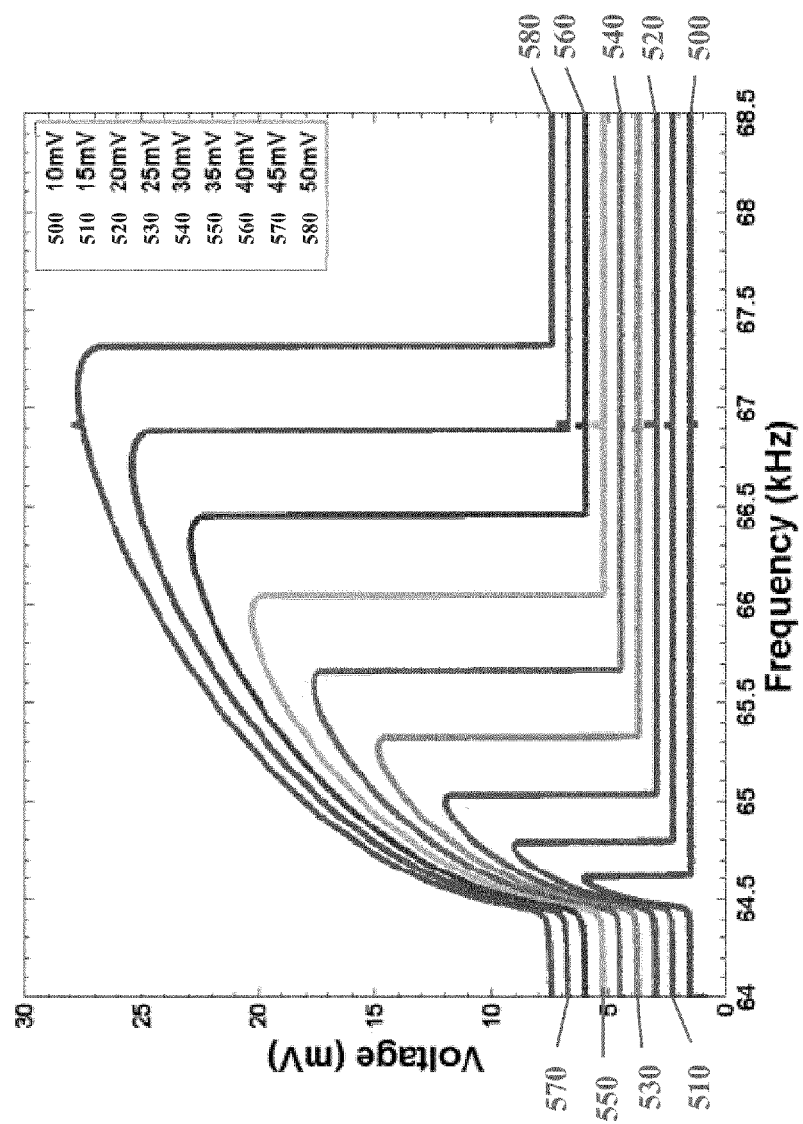
FIG. 6 is a graphical illustration of the open-loop response of the flexural resonator as a function of frequency for different AC driving voltages.
Figure 7:
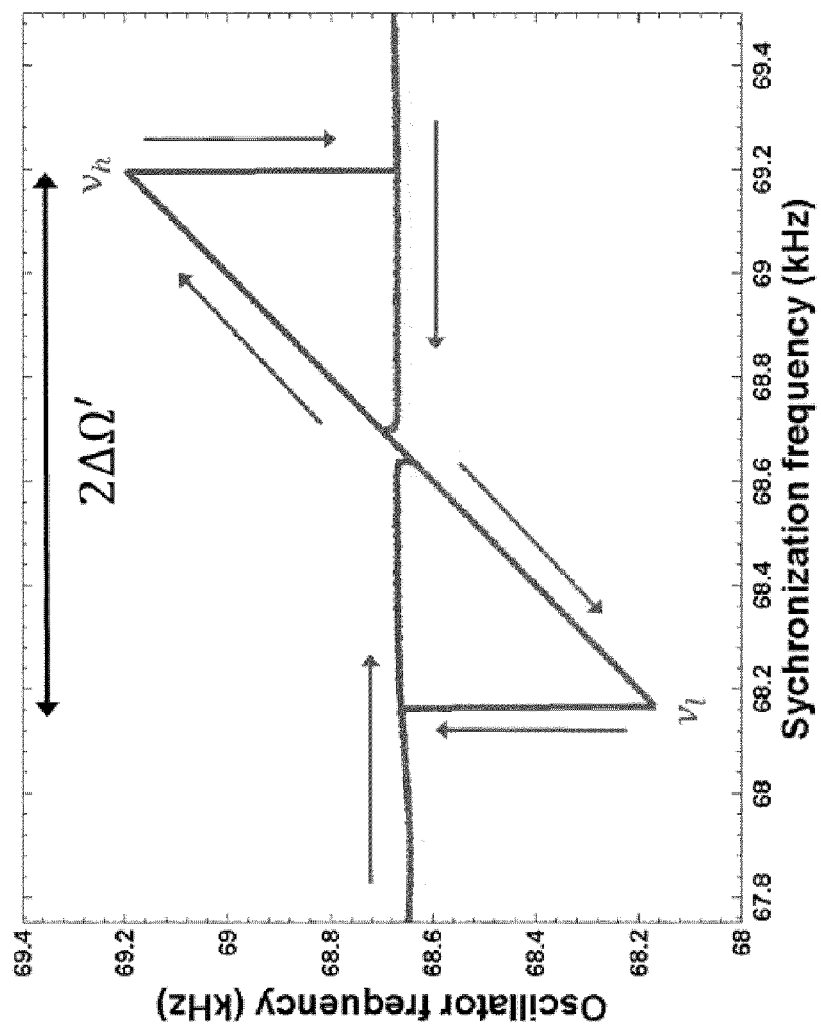
FIG. 7 is a graphical representation of the measured frequency of the oscillator with a flexural resonator when the synchronization signal is swept up and down near the operating frequency of 68,645 Hz.

FIG. 6 is a graphical illustration of the open loop response of the flexural resonator as a function of frequency for different AC driving voltages ($V_{ac}$) for the flexural resonator. All the measurements were done at room temperature and in a vacuum (pressure of $10^{-5}$ mbar), with a $V_{dc}$ of 6V and different values of $V_{ac}$. The values for $V_{ac}$ are (in millivolts): ten 500, fifteen 510, twenty 520, twenty-five 530, thirty 540, thirty-five 550, forty 560, forty-five 570, and fifty 580. The frequency was swept from low to high at the different $V_{ac}$ and the response in the flexural resonator shows a hardening non-linearity. The sharp transitions of the response curve show the bifurcation point of the resonator as it transition from one of the solutions down to another stable solution. FIG. 7 is a graphical illustration of the flexural resonator when the synchronization signal is swept up and down near the oscillator operating frequency, where the operating frequency is maintained around 68,645 Hz. The synchronization range is the total range over which the two oscillators share the same frequency, having a range of 1,042 Hz from approximately 68,160 Hz to 69,200 Hz as seen in FIG. 7.

In other embodiments, the resonator is of a parallel plate design. A parallel plate resonator can be comprised of a torsional plate suspended by serpentine springs. Two electrodes are located beneath the plate, one on each side of the center axis of symmetry. Like in the flexural resonator 100 design, the parallel plate resonator 200 has a driving electrode 204 which is used to apply a periodic electrostatic force on the resonator and a detecting electrode 202 which is used to transduce the motion of the parallel plate resonator 200 through a motional current. Due to the torsional displacement motion of the plate, the changing of the electrostatic force with the displacement produces a softening nonlinearity. In other words, the frequency decreases with increasing amplitude until the solution reaches the bifurcation point and transitions to a lower curve. For this embodiment, the driving force is limited by the size of the electrode gap, as driving the resonator with a larger force will cause the device to contact the electrodes located beneath the plate.

Figure 8:
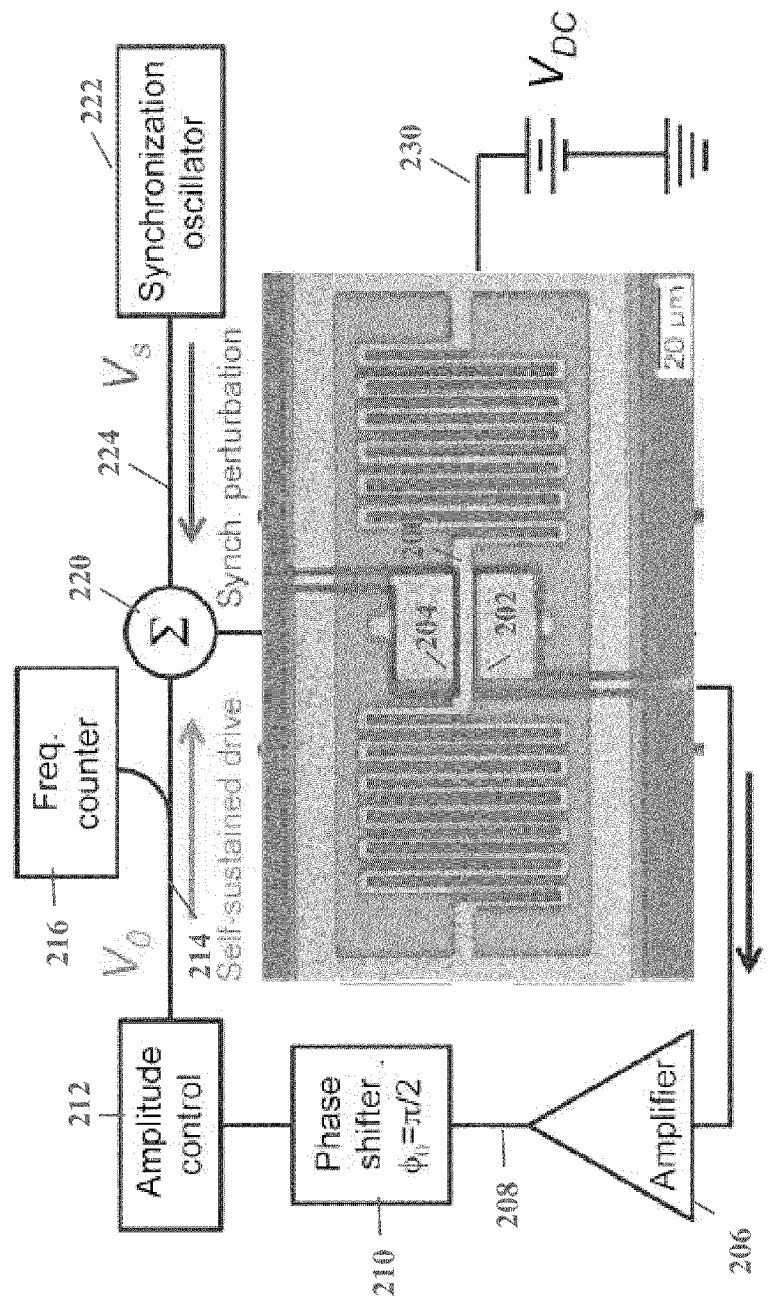
FIG. 8 is circuit schematic of a parallel plate resonator used to drive the micromechanical oscillator in a closed loop circuit.

FIG. 8 is a circuit schematic of a clamped-clamped oscillator with a parallel plate comb drive resonator 200 in a closed loop configuration that synchronizes with the frequency of an external harmonic perturbation 224. The circuitry operates in substantially the same fashion as with the flexural resonator described previously, as the motion of the resonator 200 can be detected capacitively, for example, using a detection electrode 202 that includes a capacitor. The capacitance variation of the voltage biased drive electrode generates a current that is introduced into a current amplifier 206. The amplifier 206 produces a voltage output proportional to the oscillation amplitude 208. The voltage output can be first phase shifted using a phase shifter 210. For example, the phase shifter 210 can be an active analog implementation of an all-pass filter. The phase shifted voltage can then be used as input of a phase-locked loop (PLL) in a lockin-amplifier (external reference input). The reference output of the lockin amplifier is phase locked to the input reference and its amplitude can be set by a driving amplitude control 212. The driving amplitude control 212 can include an internal function generator that sets the amplitude to a specified value.

The resulting signal at the output is phase locked to the detection signal but phase shifted and with a constant amplitude that can be set independently of the amplitude of the oscillations. The driving amplitude control 212 can include an internal function generator that sets the amplitude to a specified value. This resulting signal can be input into a driving electrode 204 that can be used to drive the resonator 200. The resulting signal can also be input in a frequency meter 216 to measure the frequency of the oscillations. The frequency meter 216 can be a digital frequency counter. The phase shift between the excitation and the detection signal determines the point in the resonance curve where the resonator 200 is phase locked. For instance, to operate the oscillator 200 in the peak of the resonance curve, the phase shift can be set to $\pi/2$. In one example, the $\pi/2$ phase shift was used to produce a maximum amplitude of oscillation.

A weak interaction with an external oscillator 222 supplying an external harmonic perturbation 224 can be added to the existing clamped-clamped oscillator system using a summation amplifier 220. The external DC voltage 230 biases the resonator 200 at $V_{dc}$. The flexural resonator 200 is constructed such that it synchronizes the oscillation frequency 114 by coupling two different vibrational signals, an internal oscillator signal with an amplitude and voltage with an external signal of an amplitude and voltage, through an internal resonator. Synchronization of the two signals is achieved by altering the external signal's frequency 224 until the external frequency 224 approaches the operating frequency 214 at which point the oscillator frequency 214 and the external frequency 224 become synched under a wide range of frequencies and for higher amplitude and voltage values. The flexural resonator 200 is the core of the feedback network for the oscillator.

Figure 9:
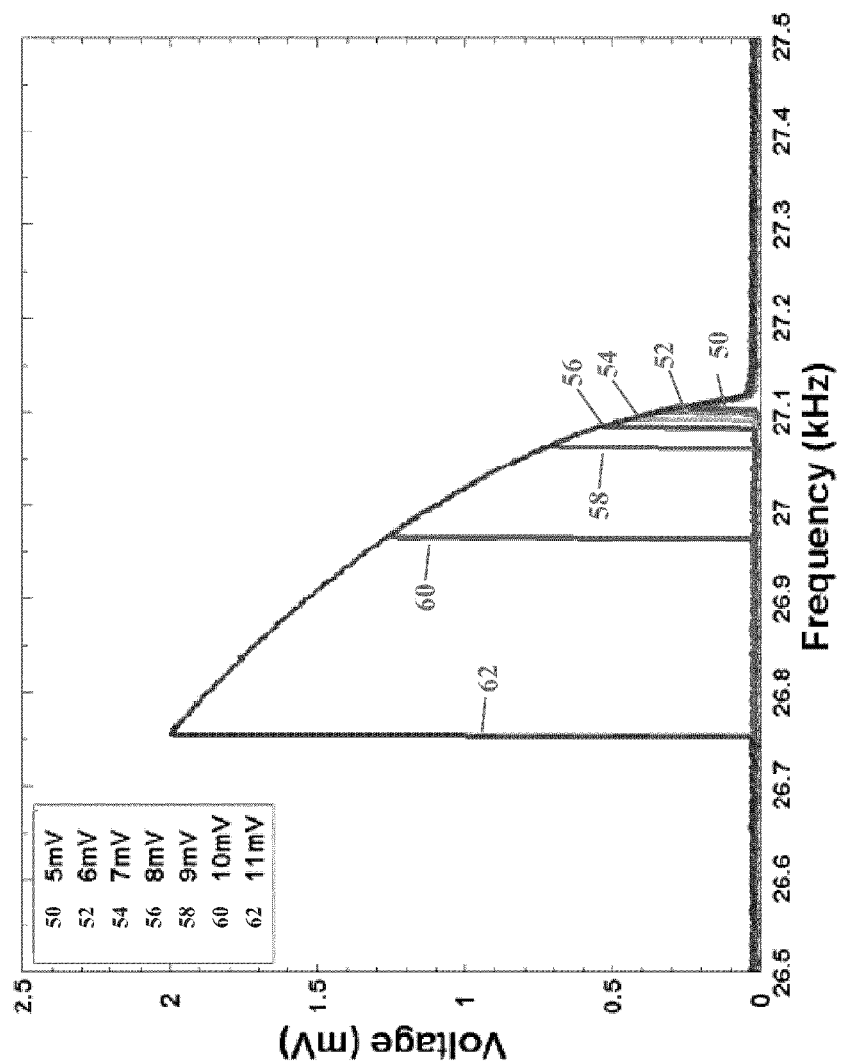
FIG. 9 is a graphical illustration of the response of the parallel plate resonator as a function of frequency for different AC driving voltages.

FIG. 9 is a graphical illustration of the open loop response of the parallel plate resonator 200 as a function of frequency for different AC driving voltages ($V_{ac}$) for the flexural resonator. All the measurements were done at room temperature and in a vacuum (pressure of $10^{-5}$ mbar), with a $V_{dc}$ of 5V and different values of $V_{ac}$. The values for $V_{ac}$ are (in millivolts): five 50, six 52, seven 54, eight 56, nine 58, ten 60, and eleven 62. In the present invention, the parallel-plate drive with a $V_{dc}$ of 5 V has a $f_0/V_0 = 2.6 \times 10^{-10}$ m/V and a nonlinear coefficient ($\beta$) of $1.5 \times 10^{19}$ $V^2/m^2 \times \alpha^2/Q^2$ and there is one electrode located beneath each half of the plate, with the folded springs used to reduce the resonant frequency. The frequency was swept from high to low at the different $V_{ac}$ and the response in the flexural resonator shows a softening non-linearity. Driving the oscillator as described in the present invention with higher voltages causes the response to deviate from the behavior predicted by the Duffing equation.

Figure 10:
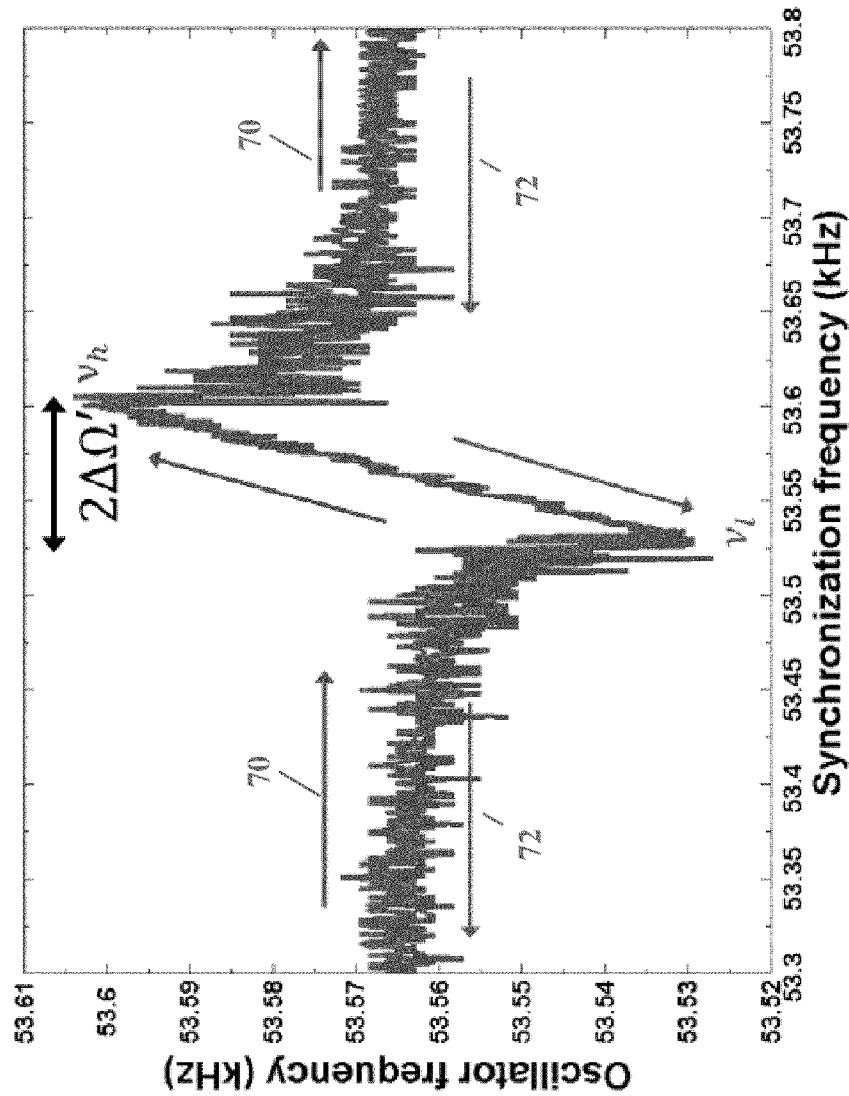
FIG. 10 is a graphical representation of the measured frequency of the oscillator with a parallel plate resonator when the synchronization signal is swept up and down near the operating frequency of 53,650 Hz.
Figure 11:
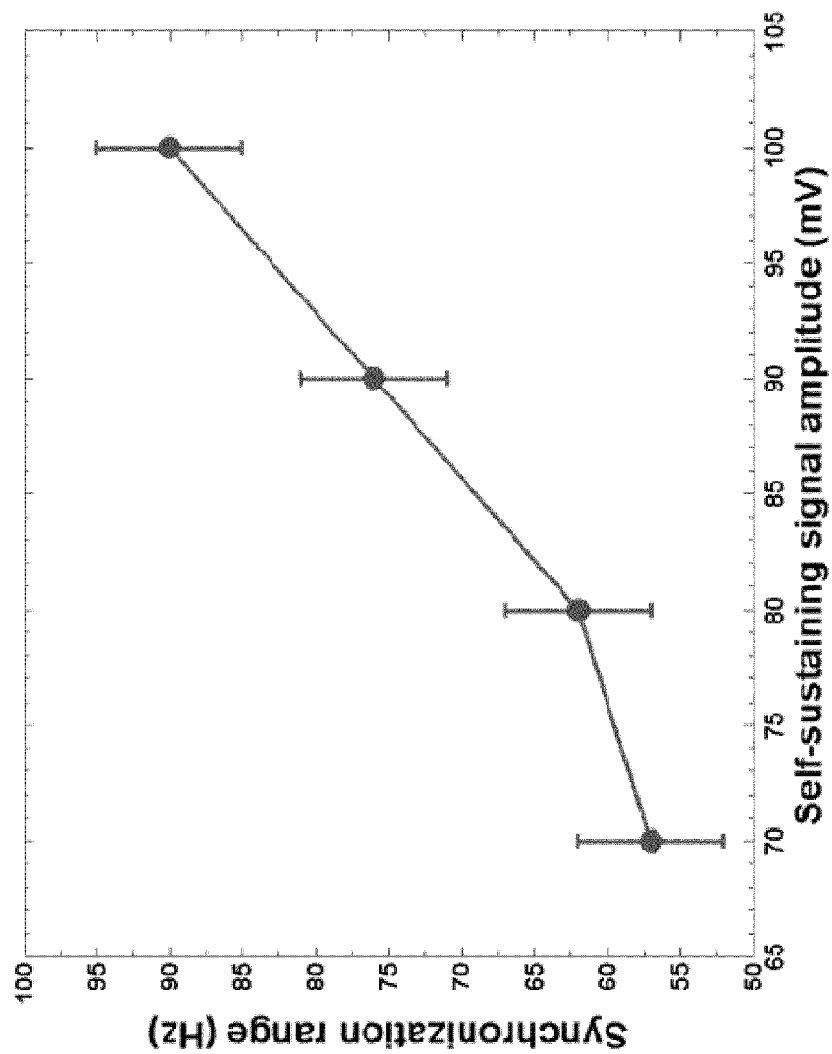
FIG. 11 is a graphical representation of synchronization behavior in relation to the measured synchronization range as a function of the self-sustained voltage, $V_0$, for the oscillator with a parallel plate resonator.

FIG. 10 is a graphical illustration of the parallel plate resonator when the synchronization signal is swept up 70 and swept down 72 near the oscillator operating frequency, where the operating frequency is maintained around 53,560 Hz. The synchronization range is the total range over which the two oscillators share the same frequency, having a range of 80 Hz from approximately 53,525 Hz to 53,605 Hz as seen in FIG. 10. FIG. 11 is a graphical illustration of the synchronization range as a function of the self-sustaining oscillator amplitude for the parallel plate resonator.

As described herein, many oscillators with either the flexural, parallel plate, or alternative resonator design can be synchronized by a master signal and the synchronization range increased by operating the oscillators in the non-linear regime. Such an application would be in an array of resonators for optical processing and communications system. Further, the present invention can be used to extend the same effect to the mutual entrainment of two or more oscillators and could assist in the development of a solution to some of the problems associated with the use of micromechanical oscillators in miniaturized devices. First, the undesired dependence of the oscillation frequency with the amplitude due to the nonlinear nature of the individual dynamics might be fixed, at least partially, by coupling oscillators with hardening and softening nonlinearities. Second, the effect of thermal noise may be reduced by producing a more robust signal from the synchronization of several oscillators with similar self-sustained frequencies.

As used herein, the singular forms "a", "an" and "the" include plural referents unless the context clearly dictates otherwise. Thus, for example, the term "a member" is intended to mean a single member or a combination of members, "a material" is intended to mean one or more materials, or a combination thereof.

As used herein, the term "approximately" generally mean plus or minus 10% of the stated value. For example, about 0.5 would include 0.45 and 0.55, about 10 would include 9 to 11, about 1000 would include 900 to 1100.

It should be noted that the term "exemplary" as used herein to describe various embodiments is intended to indicate that such embodiments are possible examples, representations, and/or illustrations of possible embodiments (and such term is not intended to connote that such embodiments are necessarily extraordinary or superlative examples).

The terms "coupled," and the like as used herein mean the joining of two members directly or indirectly to one another. Such joining may be stationary (e.g., permanent) or moveable (e.g., removable or releasable). Such joining may be achieved with the two members or the two members and any additional intermediate members being integrally formed as a single unitary body with one another or with the two members or the two members and any additional intermediate members being attached to one another.

It is important to note that the construction and arrangement of the various exemplary embodiments are illustrative only. Although only a few embodiments have been described in detail in this disclosure, those skilled in the art who review this disclosure will readily appreciate that many modifications are possible (e.g., variations in sizes, dimensions, structures, shapes and proportions of the various elements, values of parameters, mounting arrangements, use of materials, colors, orientations, etc.) without materially departing from the novel teachings and advantages of the subject matter described herein. Other substitutions, modifications, changes and omissions may also be made in the design, operating conditions and arrangement of the various exemplary embodiments without departing from the scope of the present disclosure.

While this specification contains many specific implementation details, these should not be construed as limitations on the scope of any embodiments or of what may be claimed, but rather as descriptions of features specific to particular implementations of particular embodiments. Certain features described in this specification in the context of separate implementations can also be implemented in combination in a single implementation. Conversely, various features described in the context of a single implementation can also be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Thus, particular implementations of the disclosure have been described. Other implementations are within the scope of the following claims. In some cases, the actions recited in the claims can be performed in a different order and still achieve desirable results. In addition, the processes depicted in the accompanying figures do not necessarily require the particular order shown, or sequential order, to achieve desirable results. In certain implementations, multitasking and parallel processing may be advantageous.

What is claimed is:

1. A system comprising:
   an amplifier operably connected to a phase shifter, wherein the amplifier is configured to amplify a voltage output from an oscillator or convert a current output from an oscillator to a voltage using a transimpedance amplifier and sustain an oscillator amplitude and an oscillator frequency;

the phase shifter operably connected to a driving amplitude control, wherein the phase shifter is configured to phase shift the amplified voltage;

the driving amplitude control configured to set an amplitude of the phase shifted voltage;

a summation amplifier operably connected to the driving amplitude control, wherein the summation amplifier is able to receive an external harmonic perturbation from an external synchronization oscillator which supplies an external harmonic perturbation to the system with an external voltage signal consisting of an external voltage and an external frequency;

a tunable external reference signal generator that is configured to increase or decrease the external harmonic perturbation frequency until it approaches an operating frequency;

a resonator placed into self-sustained motion and operably connected to the connection terminal wherein a first electrode in the resonator applies a periodic electrostatic force and a second electrode in the resonator is used to transduce the motion of the resonator through a motional current; and the oscillator operably connected to the resonator, wherein the phase shifted voltage drives the oscillator, the oscillator is driven to non-linear behavior, and the oscillator is synchronized with the external harmonic perturbation that is changed by the tunable external reference signal generator.

2. The system of claim 1, wherein the resonator in the oscillator has a flexural construction.

3. The system of claim 1, wherein the resonator in the oscillator has a parallel plate construction.

4. The system of claim 1, wherein the oscillator is coupled with other oscillators, wherein each oscillator in the system exhibits either a hardening or softening nonlinearity.

5. The system of claim 1, wherein the oscillator is synchronized to multiple oscillators by a master signal.

6. The system of claim 1, wherein the oscillator is a nano-mechanical oscillator.

7. The system of claim 1, wherein the oscillator is a micro-mechanical oscillator.

8. The system of claim 1, wherein the oscillator is formed from a clamped-clamped beam resonator.

9. The system of claim 1, wherein the non-linear behavior is described by the Duffing equation.

10. A method comprising:
amplifying a voltage, using an amplifier, from an oscillator;
converting a motional current to a voltage using a transimpedance amplifier, from an oscillator;
attaining an amplification and an operating frequency in the oscillator;
maintaining the operating frequency;
phase shifting the amplified voltage;
setting an amplitude of the phase shifted voltage;
placing a resonator in self-sustained motion;
coupling an external signal with a frequency into the oscillator feedback loop;
changing the external signal's frequency until the external frequency approaches the operating frequency;
driving the oscillator using the resonator, wherein the phase shifted voltage drives the oscillator to non-linear behavior, and the oscillator is synchronized with an external harmonic perturbation.

11. The method of claim 10, wherein the resonator in the oscillator has a flexural construction.

12. The method of claim 10, wherein the resonator in the oscillator has a parallel plate construction.

13. The method of claim 10, wherein an oscillator using the method is coupled with other oscillators, wherein each oscillator in the system is either in a hardening or softening nonlinearity.

14. The method of claim 10, wherein the oscillator is synchronized to multiple oscillators by a master signal.

15. The method of claim 10, wherein the oscillator is a nano-mechanical oscillator.

16. The method of claim 10, wherein the oscillator is a micro-mechanical oscillator.

17. The method of claim 10, wherein the oscillator is formed from a clamped-clamped beam resonator.

18. The method of claim 10, wherein the non-linear behavior is a hardening non-linearity.

19. The method of claim 10, wherein the non-linear behavior is a softening non-linearity.

20. A system comprising:
an amplifier operably connected to a phase shifter;
the phase shifter operably connected to a driving amplitude control;
a summation amplifier operably connected to the driving amplitude control, wherein the summation amplifier is able to receive an external harmonic perturbation from an external synchronization oscillator which supplies an external harmonic perturbation to the system with an external voltage signal consisting of an external voltage and an external frequency;
a resonator capable of self-sustained motion and operably connected to the connection terminal wherein a first electrode in the resonator applies a periodic electrostatic force and a second electrode in the resonator is used to transduce the motion of the resonator through a motional current and the resonator achieves an amplitude large enough to demonstrate a non-linear response; and
the oscillator operably connected to the resonator, wherein the phase shifted voltage drives the oscillator, such that the oscillator is synchronized with the external harmonic perturbation.

* * * * *